(12) United States Patent
Ziger et al.

(10) Patent No.: US 7,884,302 B2
(45) Date of Patent: Feb. 8, 2011

(54) PLASMA PROCESSING INSTALLATION, INFLUENCED BY A MAGNETIC FIELD, FOR PROCESSING A CONTINUOUS MATERIAL OR A WORKPIECE

(75) Inventors: Peter Ziger, Grabenstrasse 40, Graz (AT) A-8010; Helmut Jäger, Hausmannstatten (AT); Christian Neureiter, Graz (AT)

(73) Assignee: Peter Ziger, Graz (AT)

( * ) Notice: Subject to any disclaimer, the term of this patent is extended or adjusted under 35 U.S.C. 154(b) by 1117 days.

(21) Appl. No.: 10/545,549

(22) PCT Filed: Feb. 9, 2004

(86) PCT No.: PCT/AT2004/000043

§ 371 (c)(1),
(2), (4) Date: Aug. 18, 2006

(87) PCT Pub. No.: WO2004/073009

PCT Pub. Date: Aug. 26, 2004

(65) Prior Publication Data

US 2007/0000881 A1    Jan. 4, 2007

(30) Foreign Application Priority Data

Feb. 12, 2003  (AT) ................ A 208/2003
Jan. 30, 2004  (AT) ................ A 128/2004

(51) Int. Cl.
*B23K 9/00* (2006.01)
*B01J 19/08* (2006.01)

(52) U.S. Cl. .............. 219/121.47; 422/186.05

(58) Field of Classification Search ......... 219/121.36–121.47; 422/186.04–186.06, 186.21–186.26; 204/121.36–121.47
See application file for complete search history.

(56) References Cited

U.S. PATENT DOCUMENTS

| | | | |
|---|---|---|---|
| 3,211,886 A | | 10/1965 | Barkan et al. |
| 3,533,358 A | * | 10/1970 | Leuenberger ............. 104/114 |
| 3,728,246 A | * | 4/1973 | Barkhudarov .......... 204/298.16 |
| 3,884,793 A | | 5/1975 | Penfold et al. |
| 4,318,533 A | * | 3/1982 | Port ........................ 254/273 |
| 4,543,470 A | * | 9/1985 | Santen et al. ............... 219/383 |
| 4,842,704 A | | 6/1989 | Collins et al. |

(Continued)

FOREIGN PATENT DOCUMENTS

DE          2157 606          5/1973

(Continued)

*Primary Examiner*—Sang Y Paik
(74) *Attorney, Agent, or Firm*—Merchant & Gould P.C.

(57) ABSTRACT

An installation for the plasma processing of a continuous material (1) includes an evacuatable discharge chamber (3a, 3b) and a device for setting a gas atmosphere in the discharge chamber (3a, 3b). The device for setting a gas atmosphere includes a prechamber system (10, 11, 12) and a postchamber system (2), with sluice openings between the chambers (2, 3a, 3b, 10, 11, 12). The continuous material (1) is guided with low friction through the prechamber system (10, 11, 12) and the postchamber system (2). The device for setting a gas atmosphere includes a recovery system wherein gas can be recirculated from a postchamber (2a ... 2k) into a prechamber (10, 11, 12) and/or postchamber (2a ... 2k) having a higher pressure level so that processing is effected in a gas-saving manner.

22 Claims, 6 Drawing Sheets

U.S. PATENT DOCUMENTS

Figure 1:
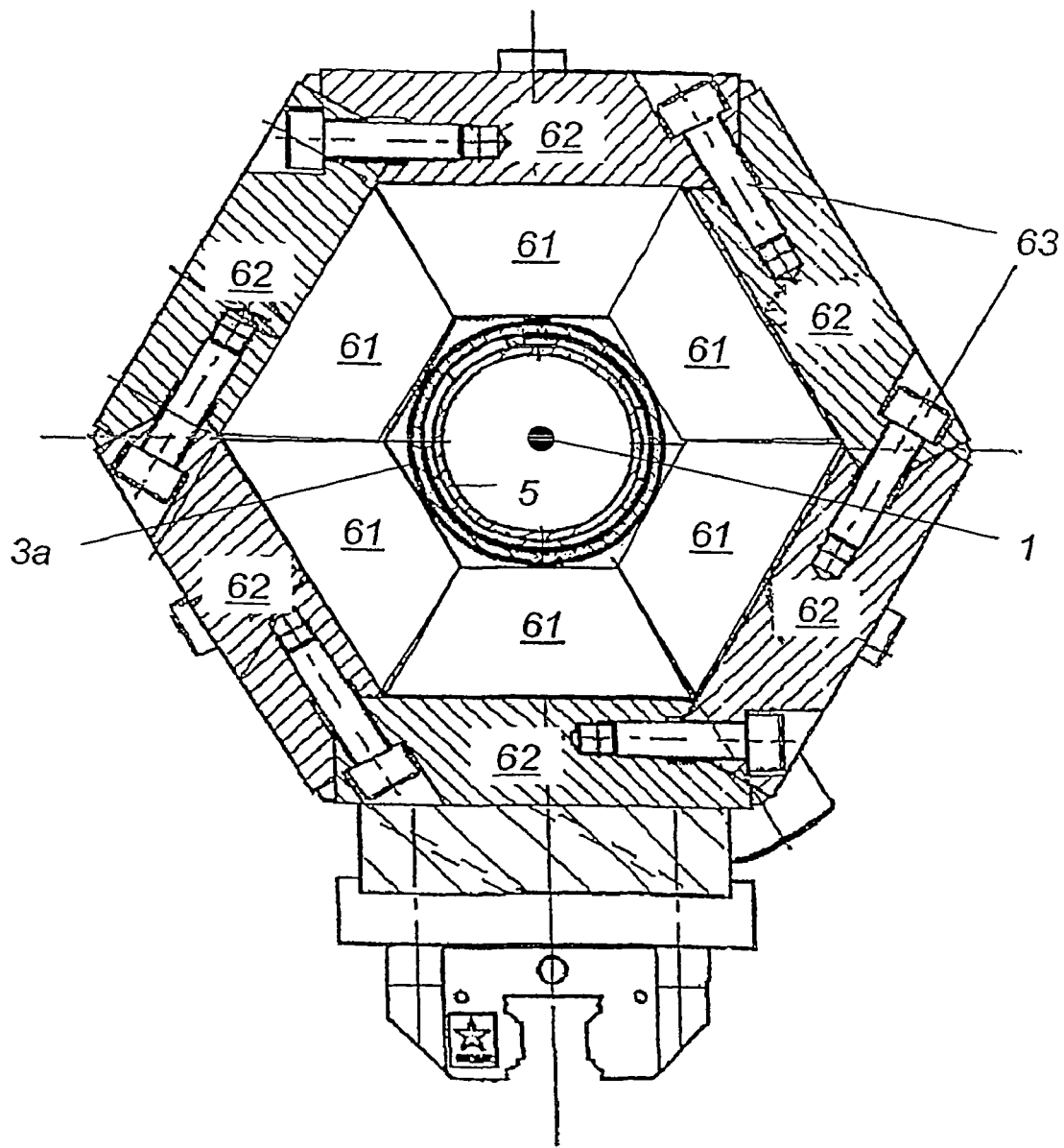

| | | | |
|---|---|---|---|
| 4,950,450 | A | 8/1990 | Chatterjee et al. |
| 4,950,956 | A | 8/1990 | Asamaki et al. |
| 5,234,560 | A | 8/1993 | Kadlec et al. |
| 5,317,006 | A | 5/1994 | Kumar |
| 5,490,910 | A | 2/1996 | Nelson et al. |
| 6,471,920 | B2 * | 10/2002 | Aigner et al. .......... 422/186.05 |
| 6,974,501 | B1 * | 12/2005 | Zhang et al. .................. 117/84 |

FOREIGN PATENT DOCUMENTS

| | | |
|---|---|---|
| DE | 30 41 095 | 5/1982 |
| DE | 42 11 167 | 10/1993 |
| DE | 199 07 911 | 9/2000 |
| DE | 100 01 381 | 7/2001 |
| EP | 0 313 154 | 4/1989 |
| EP | 0 966 021 | 12/1999 |
| EP | 0 981 150 | 2/2000 |
| EP | 1 178 134 | 2/2002 |
| FR | 2 774 400 | 8/1999 |
| JP | 57-41318 | 3/1982 |

* cited by examiner

PLASMA PROCESSING INSTALLATION, INFLUENCED BY A MAGNETIC FIELD, FOR PROCESSING A CONTINUOUS MATERIAL OR A WORKPIECE

The invention relates to an installation for the plasma processing influenced by a magnetic field of a continuous material, comprising at least one evacuatable discharge chamber, with an external electrode contained therein, in particular an anode that is electrically insulated and arranged around the continuous material, a device for setting a gas atmosphere in the at least one discharge chamber, an energy supply device for providing a voltage or a current, respectively, which is sufficient for a gas discharge between the continuous material acting as an internal electrode, in particular as a cathode, and the external electrode, wherein, in order to significantly increase the obtainable energy density of the gas discharge, a high-performance magnet assembly for generating a magnetic field, in particular of at least 50 mT, preferably of at least 100 mT, optionally in excess of 400 mT, is arranged in the area of the external electrode, preferably outside of the external electrode, comprising a guide means for the continuous transport of the continuous material through the at least one discharge chamber, with the magnetic field of the high-performance magnet assembly being oriented essentially parallel to the continuous material, wherein the device for setting a gas atmosphere comprises a prechamber system and a postchamber system, with sluice openings being provided between the chambers of said systems, through which openings the continuous material can be guided with low friction through the prechamber system and the postchamber system.

Plasma processing is used for the treatment of workpieces and continuous material, respectively, for heating, for purification, for (de)oxidation, for degreasing, for other types of grinding, for vapour-depositing, sputtering or other coatings. Conventional installations for the plasma processing of a continuous material or of a workpiece produce plasma current densities of merely a few mA/cm$^2$, which necessitate a relatively long process time. For the processing of continuous material, this involves relatively slow performance speeds, and for the processing of a workpiece, this means long residence times in the installation, which in turn is associated with substantial costs.

From U.S. Pat. No. 3,211,886, an apparatus for the purification of an electrically conductive elongated material by means of an arc discharge is known. Two coils generate a magnetic field around the discharge zone, which magnetic field is parallel to the elongated material. A process gas is supplied to the discharge space and is withdrawn and recovered from the discharge space via an outlet.

A disadvantage of the device of U.S. Pat. No. 3,211,886 is that the guide sleeves rub against the elongated material, as a result of which the processing speed is limited and, furthermore, the installation is suitable only for elongated material of merely one diameter. However, the use of guide sleeves that are larger compared to the elongated material and the processing, respectively, of elongated material with diameters which possibly are significantly smaller than the opening of the guide sleeves would involve a substantial loss of process gases.

EP 1 178 134 A illustrates a process and a device for a continuous plasma treatment of metallic substrates which are exposed to a plasma and a magnetic field between a substrate and a counterelectrode. Via the magnetic field, the plasma is thereby equally confined around the entire substrate by confining free electrons to an area within the plasma.

U.S. Pat. No. 5,317,006 A discloses a cathode for a sputtering system, comprising a metallic outer cylinder and, within said cylinder, a target material arranged in a polygonal cross-sectional shape for the formation of a film of high temperature superconducting material on a substrate within said polygonal shape. In this case, however, the substrate is different from the anode and the cathode.

EP 0 313 154 A discloses a coil for the generation of a magnetic field for increasing the plasma density but does not contain any indication whatsoever as to high-performance magnetic fields beyond 50 mT.

JP 57 041318 A shows a recovery of a process gas from a heat treatment furnace, wherein the process gas is recovered via a fan only from the heating zone. No magnet assembly is shown.

The object of the invention is to indicate an installation for plasma processing according to the preamble of claim 1, which is able to produce significantly higher plasma current densities, in particular in an order of magnitude of one A/cm$^2$, and thus allows notably higher processing speeds.

This is achieved according to the invention in that the device for setting a gas atmosphere comprises a recovery system wherein gas can be recirculated from a postchamber into a prechamber and/or postchamber having a higher pressure level.

Thus, processing can be effected in a particularly gas-saving manner, which is significant in particular for expensive process gases such as helium. Furthermore, with a guide mechanism designed with such a low amount of friction and with possible processing speeds that are particularly high, it is possible at the same time to maintain the gas atmosphere required for the gas discharge. Such an installation is particularly suitable for the efficient treatment of continuous material.

By generating magnetic fields which are so strong, in particular normal to the discharge direction, exceedingly high plasma current densities, especially in the range of A/cm$^2$, can be produced. Thereby, the charge carriers are deflected by the Lorenz force, wherein the curvature radii of the electrons are smaller or, at most, are in the same order of magnitude as the free paths of the plasma particles (typically in the range of tenths of millimeters). Because of the magnetic field, the plasma becomes more conductive so that the discharge preferably only burns in the volume penetrated by the magnetic field.

The plasma can be ignited at a given pressure, and very large currents can be passed through without the plasma "burning out of" the magnetic field. Hence, one gets by with a single value for the pressure for the entire process.

In addition, the ignition voltage of the plasma is reduced to near the burning voltage, which makes redundant the specific ignition arrangements, procedures or other ignition aids which otherwise are usually used for glow discharge arrangements.

It is most important, however, that the magnetic field component arranged vertically to a nascent arc channel interferes strongly with the arc since electrons are hurled from the conductive channel by the magnetic force. Thus, using this assembly, significantly larger currents can be conducted through the plasma per unit of electrode length without the formation of an arc. Consequently, the continuous material or the workpiece, respectively, can be processed faster with the same treatment effect (e.g. with the same heating to be achieved), eventually permitting a significant increase in the output of the entire installation. Furthermore, the burning zones remain spatially defined. Since the plasma is spatially restricted by the magnetic field, a measure against the formation of "hot spots" is thus also provided: Overheated parts can now no longer attract a disproportionate share of the current. Moreover, due to the higher ionization in the volume, the plasma is less dependent on the secondary electrons. Furthermore, equivalent charge-carrier densities are now produced with less particles, i.e. at a lower pressure—the plasma thus burns with the same power at a lower pressure. This also promotes a better intermixing of particles. All this inhibits the formation of hot spots.

In a particular embodiment of the invention, it may be provided that the high-performance magnet assembly is designed as a superconducting electromagnet.

Superconducting electromagnets are suitable for generating the required high magnetic fields and furthermore provide the advantage that, by means of them, a controllable magnetic field can also be generated by controlling the current flowing through them so that the magnetic field can easily be adapted to certain applications.

In another embodiment of the invention, it may be provided that the high-performance magnet assembly is designed as a permanent magnet assembly.

The use of permanent magnets involves the advantage that no additional current is required for generating a magnetic field, which is why the operation of the installation is more cost-saving.

In particular, it may be provided that the permanent magnet assembly is composed of permanent magnets, in particular of anisotropic permanent magnets, preferably of NdFeB permanent magnets, which essentially form the side walls of a prism having a polygonal cross-section.

Due to the fact that a permanent magnet assembly is composed of permanent magnets in the form of a prism, particularly convenient magnetic field flows can easily be realized in the discharge chamber. The use of anisotropic permanent magnets, preferably of NdFeB permanent magnets, enables the generation of particularly strong magnetic fields.

In a particular embodiment of the invention, it may be provided that the cross-section of the prism is configured as a square or a hexagon.

Said embodiments can be implemented with particular ease.

In an advanced embodiment of the invention, it may be provided that iron yoke elements are provided which concentrate the magnetic field of the permanent magnet assembly in the area of the gas discharge.

By the comparatively cheap iron yoke elements, the effect of the permanent magnets can be significantly increased in the area of the gas discharge.

In a particular embodiment of the invention, it may be provided that the permanent magnets are each arranged essentially normal to iron yoke elements located adjacent to them so that in each case exactly one pole of a permanent magnet abuts the iron yoke element.

Thus, with a relatively small number of permanent magnets, a strong, essentially homogeneous magnetic field can be concentrated in the area of the desired gas discharge. In a particular embodiment of the invention, it may be provided that a device for adjusting the magnetic fields of the permanent magnets to defined restricted current flows is provided. In this way, the installation can be adjusted to changed requirements with a small effort. The defined restricted current flows may also be used for the demagnetization of permanent magnets.

In particular, it may be provided that at least one permanent magnet and/or at least one iron yoke element is/are arranged in a removable, replaceable, displaceable or twistable fashion. In this way, the installation can be adjusted to changed requirements with a small effort without the need to reverse the magnetic poles of individual permanent magnets.

Furthermore, it may be provided that the external electrodes and/or the high-performance magnet assembly are coolable, in particular liquid-coolable.

In this way, these elements can be reliably prevented from overheating.

In a particular embodiment of the invention, it may be provided that the device for setting a certain gas atmosphere comprises a regulating or control system, respectively, comprising vacuum pumps, preferably slide vane rotary pumps, and/or valves, by means of which the gas atmosphere can be adjusted to a pressure adapted to a selected gas atmosphere.

In this way, the gas pressure required for a particular application can be generated easily. Thereby, in particular slide vane rotary pumps prove to be a cheap but yet adequate variant. In particular, it may be provided that the device for setting a gas atmosphere can be adjusted to noble gases, especially to helium.

In this way, safe operation of the installation with noble gases can be ensured.

In a particular embodiment of the invention, it may be provided that the device for setting a gas atmosphere can be adjusted to noble gases, in particular to helium, argon or krypton, with an addition of preferably one to ten, especially one to three, percent of a chemically active, in particular oxidizing or reducing, gas or vapour such as, for example, hydrogen, an alcohol or an alkane.

With such a setting, the advantageous properties of helium (safe, relatively good cooling gas) and hydrogen (excellent cooling gas, readily ionizable in comparison with helium, purifying effect due to deoxidation) are combined in a particularly suitable manner. A noble gas acts as an energy pump which creates atomic states having a high excitation energy and long residence times, whereby the chemically active gas or the vapour is brought to a higher energy state (ion, excited atom, free radical) and fully develops its chemical activity.

In a further embodiment of the invention, it may be provided that the energy supply device is adjusted to a direct-current voltage, in particular to a pulsed direct-current voltage, between the external electrode and the continuous material or the workpiece, respectively, wherein the pulses can partly also have reversed or varying polarities.

In the present case, a direct-current voltage is suitable for a gas discharge. A pulsed direct-current voltage suppresses the undesirable transition of the gas discharge into an arc discharge with a fixed focal point. Different voltage or current flows, respectively, of the pulses such as, for example, square wave voltages and square wave current flows, respectively, can be advantageous for different processes.

In an advanced embodiment of the invention, it may be provided that the prechambers are divided into subchambers and/or the postchamber system is composed of individual postchambers, with sluice openings being provided between the subchambers and the postchambers, respectively, via which openings the continuous material can be guided with low friction through the subchambers and the postchambers, respectively.

The formation of subchambers and postchambers allows the desired atmosphere to be safely maintained in the discharge chamber even if the continuous material is guided with low friction and prevents air from undesirably entering said chamber.

In a specific embodiment of the invention, it may be provided that at least one postchamber is designed as a gas cooling chamber. Thus, the continuous material can be cooled in air prior to its discharge and undesired oxidation can be prevented.

In another embodiment of the invention, it may be provided that the guide means comprises one guide pulley each at the beginning and at the end, respectively, of the installation, the two guide pulleys preferably having different diameters.

With such a design of the guide pulleys, mechanical vibrations of the continuous material, as they should be expected especially in case of higher flow rates, can be reduced.

In an advanced embodiment of the invention, it may be provided that the guide means comprises a guide element to provide mechanical support, preferably a guide aperture, a lug, a coil or crossed plates, in an area between two discharge chambers. In this way, mechanical vibrations of the continuous material can be reduced further.

In an advanced embodiment of the invention, it may be provided that the vacuum pumps are aligned with the prechambers and the postchamber system such that a pressure gradation can be adjusted, preventing ambient air from entering the discharge chambers.

In this way, it can be ensured that the required atmosphere is maintained in the discharge chambers even in case of relatively large inlet and outlet openings, respectively.

In another embodiment of the invention, it may be provided that a prepurification stage comprising coarse drying is arranged in the working direction prior to the prechambers.

Via such a prepurification, the process time in the discharge chamber can be kept shorter and hence the processing speed can be increased further. Most notably, service and purification operations, respectively, at the installation will be necessary less often.

Furthermore, it may be provided that a liquid cooling stage, in particular a water cooling stage, is arranged in the working direction after the postchamber system.

Such a cooling stage enables a particularly quick cooling of the continuous material and thus, quite reliably, prevents said material from oxidizing undesirably in the air.

Figure 2:
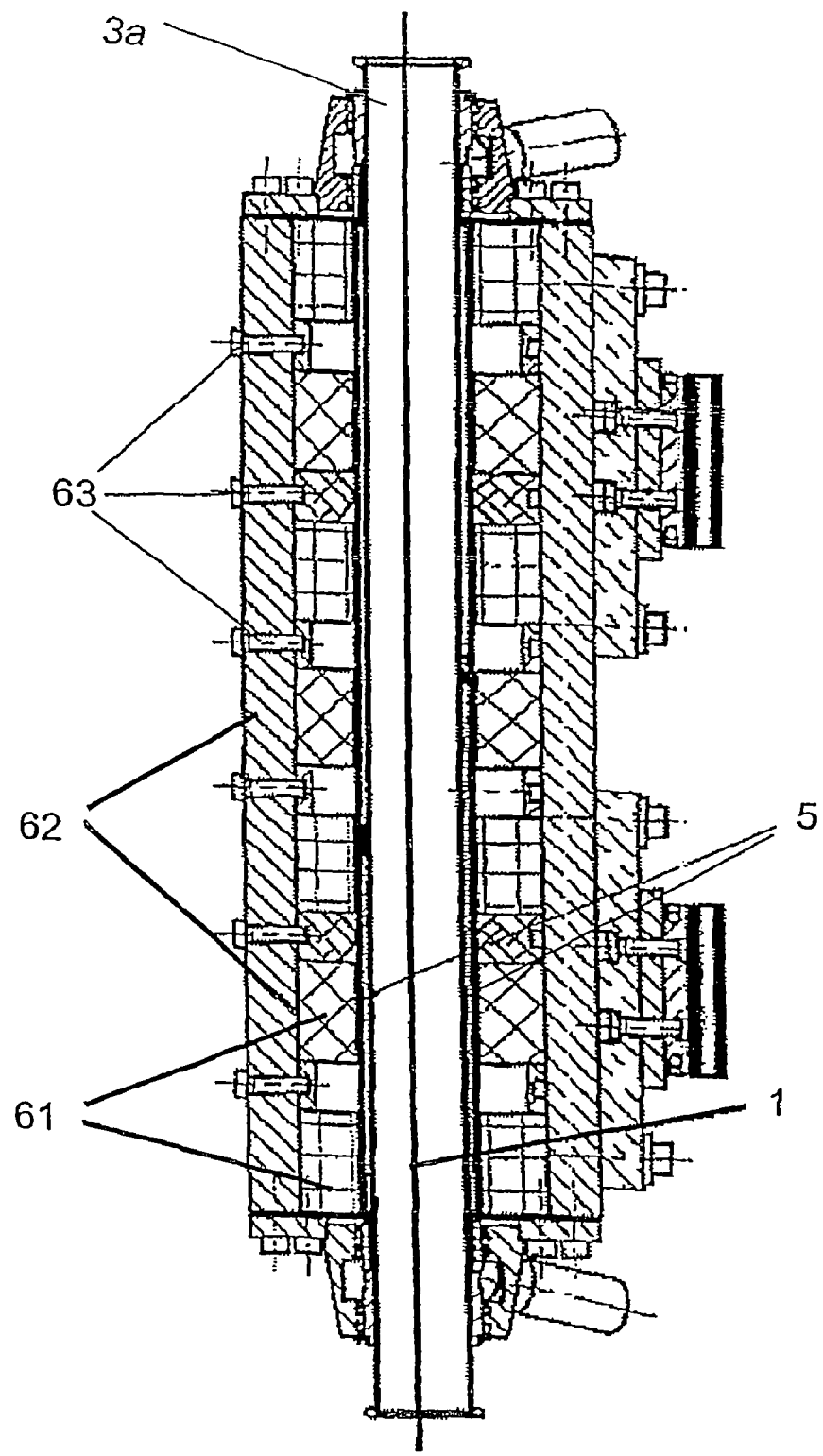
Figure 4:
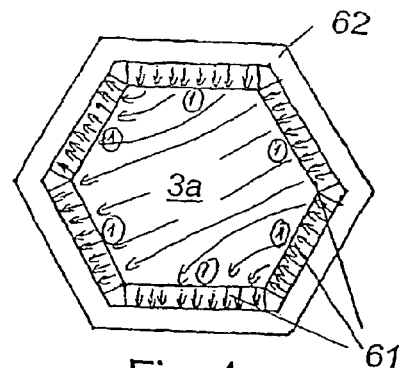
Figure 5:
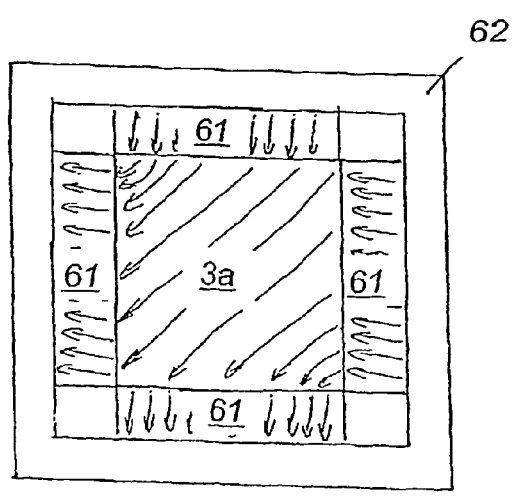
Figure 6:
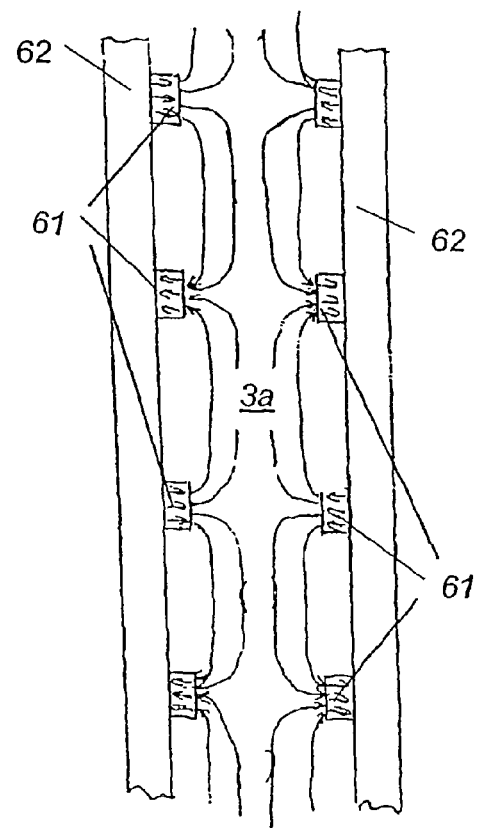
Figure 7:
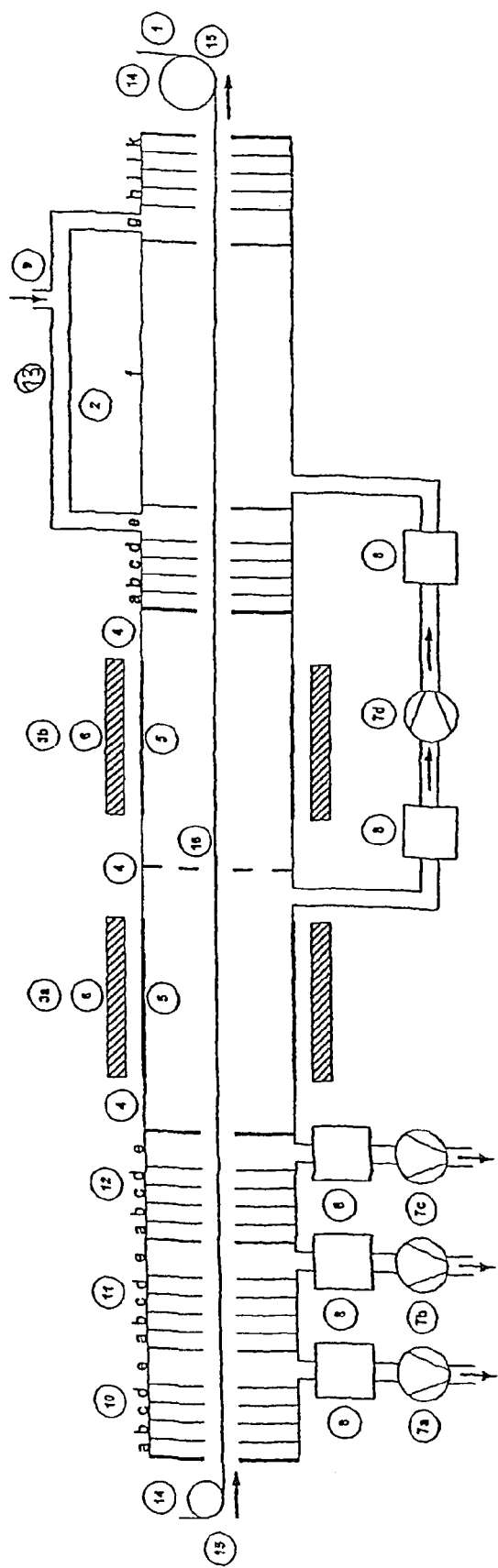
Figure 8:
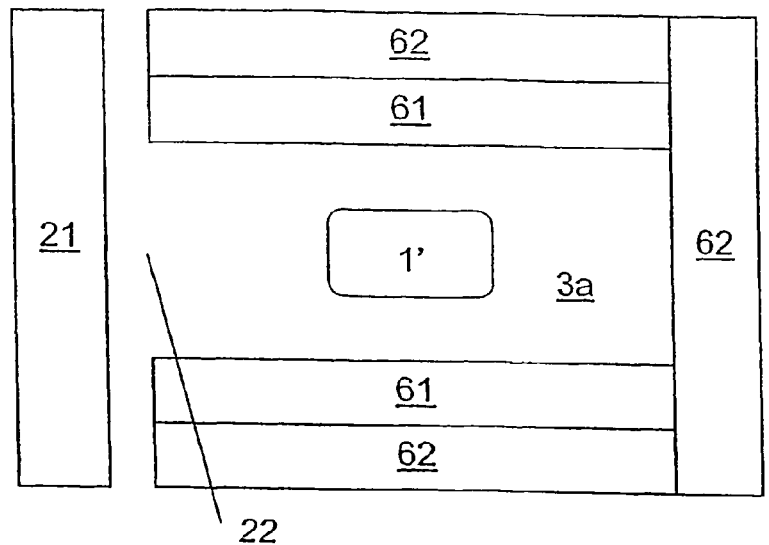
Figure 9:
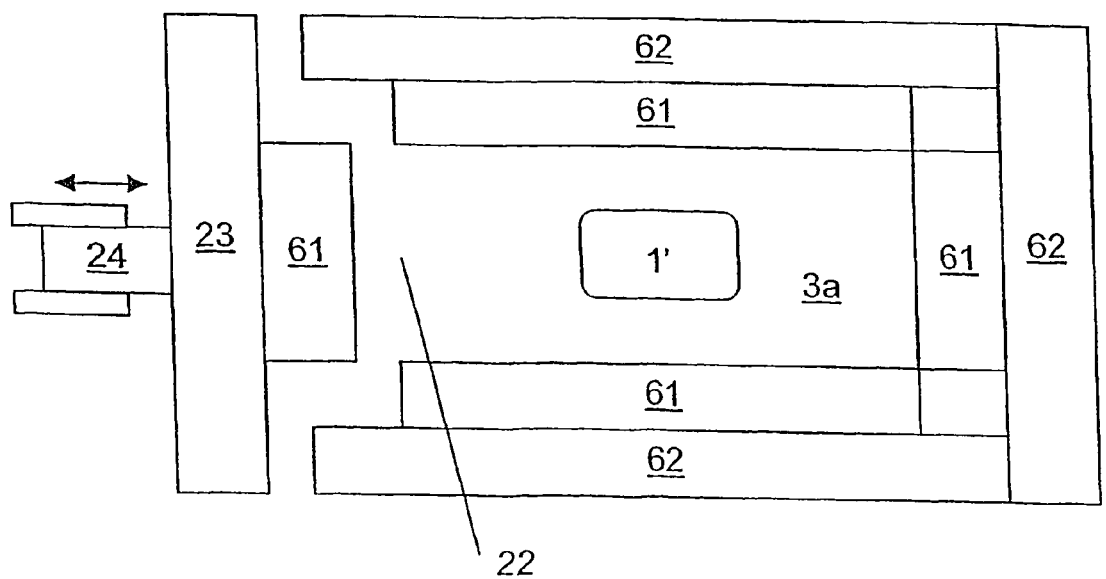
Figure 10:
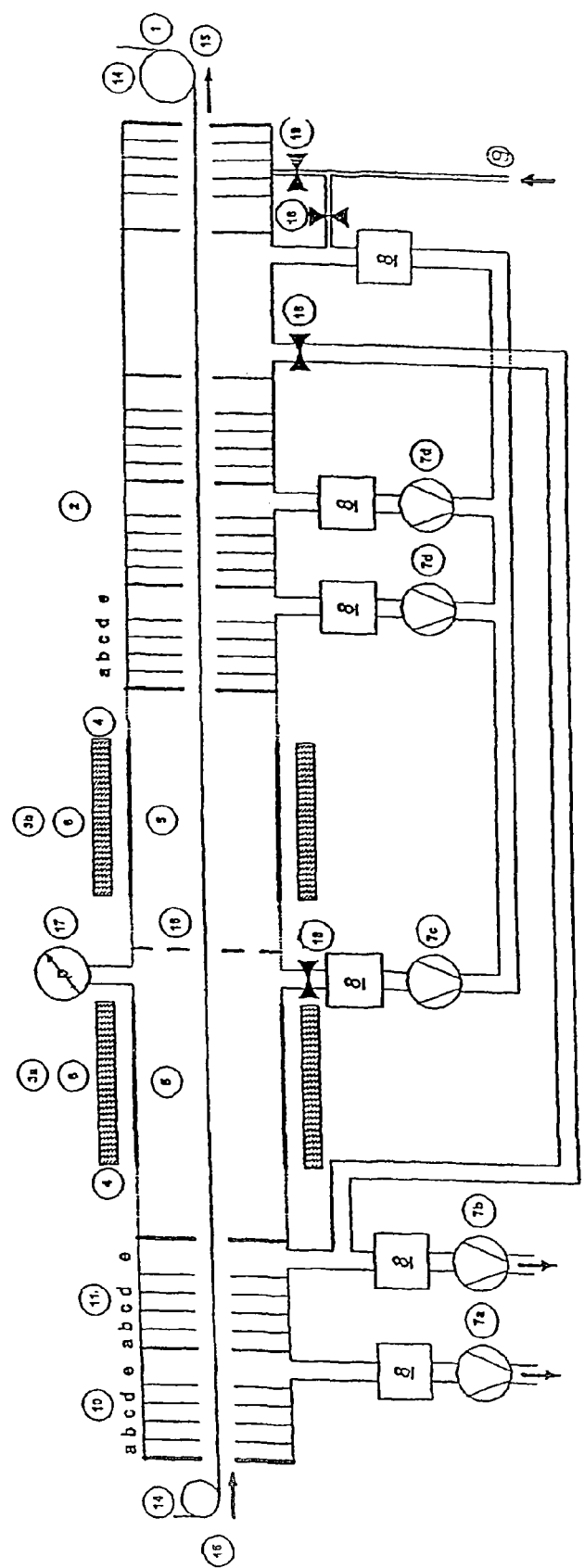

The invention is described in greater detail with reference to the appended drawings in which embodiments are illustrated. Therein:

FIG. 1 shows a cross-section through an installation for plasma processing having a permanent magnet assembly with iron yoke elements, FIG. 2 shows a longitudinal section through an installation according to FIG. 1, FIGS. 3 to 5 show further cross-sections through permanent magnet assemblies with iron yoke elements, FIG. 6 shows a longitudinal section through a permanent magnet assembly with iron yoke elements, FIG. 7 shows a longitudinal section through an installation for the plasma processing of continuous material, FIG. 8 shows a longitudinal section through an installation for the plasma processing of workpieces, with the lid open, FIG. 9 shows a longitudinal section through an installation for the plasma processing of workpieces, with the plate and the actuating device being open, and FIG. 10 shows a longitudinal section through a further embodiment of an installation for the plasma processing of continuous material.

FIG. 1 shows a section through an installation according to the invention, which, in the following, will be described from the inside to the outside. In this case, the material to be processed is a continuous material 1 which is surrounded by an external electrode 5 and is guided through a discharge chamber 3a enclosing the external electrode 5. The discharge chamber is surrounded by a permanent magnet assembly 6 which, in this case, is composed of six permanent magnets 61. The permanent magnet assembly 6 can also be arranged inside the external electrode 5. The permanent magnets 61 are preferably made of an anisotropic material, i.e. they exhibit a preferred orientation. As a matter of fact, such anisotropic permanent magnets 61 can be magnetized more strongly than isotropic ones. In particular permanent magnets 61 made of an NdFeB-alloy are well suitable in this case. The six permanent magnets 61 thereby essentially form a hexagon. Various magnetization directions of the permanent magnets 61 are conceivable. A possible variant of the polarization arrangement which produces reasonably homogeneous field ranges in the discharge chamber 3a is illustrated in FIG. 6.

For better focussing of the magnetic field within the discharge chamber 3a, iron yoke elements 62 can be provided which are arranged around the permanent magnet assembly 6. Said iron yoke elements 62 can be firmly connected with fixing means 63, wherein the fixing means 63 can also be designed so as to be detachable, for instance as screws. A mechanically stable arrangement of permanent magnets 61 or of iron yoke elements 62, respectively, may also be carried out inside a steel pipe.

FIG. 2 shows, in a longitudinal section, the same installation as in FIG. 1. The differently hatched permanent magnets 61 indicate different magnetization directions of the same. A possible magnetization arrangement is illustrated in FIG. 6.

Figure 3:
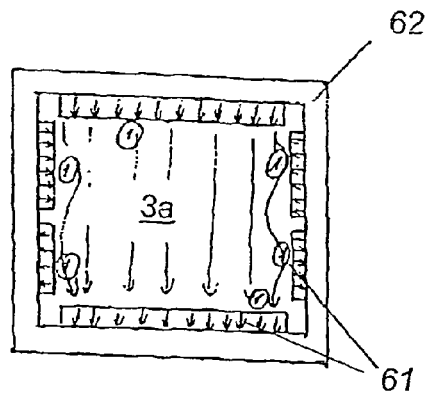

FIGS. 3 to 5 show cross-sections through arrangements of permanent magnets 61 comprising iron yoke elements 62, wherein examples of possible magnetization directions are indicated by the arrows illustrated in the permanent magnets 61. The arrows inside the discharge chamber 3a symbolize the magnetic lines of force within said chamber. In addition to the illustrated rectangular and hexagonal cross-sections, other polygonal geometries of arrangements of permanent magnets 61 are conceivable as well.

Via temporary current flows which in each case are sent around one permanent magnet 61, the intensity and direction, respectively, of magnetization can be altered. Thus, using a single assembly of permanent magnets 61, different magnetic fields can be generated in one discharge chamber 3a. This is significant especially if workpieces 1' of different geometries are to be plasma-processed.

However, it is also conceivable to adjust a magnetic field to required geometries and processes by modifying the arrangement (removal, replacement, displacement or twist) of permanent magnets 61 or of iron yoke elements 62, respectively.

In order to prevent overheating of the high-performance magnet assembly, which might lead to an impairment of the magnetic field to be generated, a cooling of the high-performance magnet assembly can be provided. Liquid cooling as well as gas cooling, preferably air cooling, are conceivable in this case.

Strong magnetic fields can also be generated by superconducting electromagnets, which may be provided as a high-performance magnet assembly instead of a permanent magnet assembly 6. Such superconducting electromagnets may also be used for generating magnetic fields of different characteristics inside a discharge chamber 3a by varying the current strength flowing through them as well as the current direction.

FIG. 7 and FIG. 10 show exemplary embodiments of an installation for the plasma processing of continuous material 1. After two or three prechamber systems 10, 11, 12, which each consist of several subchambers, e.g. 10a, 10b . . . , and are in each case pumped out at the final subchamber 10e, 11e, 12e, the continuous material 1 passes through two discharge chambers 3a, 3b toward the postchamber system 2a . . . 2k.

Said system consists of a long postchamber 2f acting as a gas cooling section as well as of small chambers arranged upstream and downstream, which in turn are interconnected by sluice openings. The plurality of sluice openings in combination with an adjustable pressure gradation minimizes the gas flow, the gas consumption and the required pumping capacity. The gas flows from the postchamber system 2 into the second discharge chamber 3b, whereupon the gas flow is split up. A major part is guided through a vacuum pump 7d, upstream and downstream of which filters 8 are arranged, back into the postchamber 2f designed as a gas cooling section. A small portion of the gas flows into the first discharge chamber 3a and reaches the outside via the pump 7c through the final sluice of the third prechamber 12e. In this manner it is ensured that the second discharge chamber 3b operates with a very clean gas, whereas the plurality of the evaporations which are released from the continuous material 1 in the first discharge chamber 3a are mixed with a relatively small amount of the working gas and reach the outside via a vacuum pump 7c. The gas supply 9 to the entire installation is effected via the transverse supply pipe 13 involving an excess pressure that is relatively tiny in comparison with the atmospheric pressure (e.g. 0.1 bar). In contrast, the pressure in the postchamber 2f designed as a gas cooling section is significantly higher, resulting there in a better cooling capacity of the continuous material 1. In this way, a recovery system can be implemented wherein gas is recirculated from a discharge chamber 3a, 3b into a prechamber 10, 11, 12 and/or postchamber 2a . . . 2k having a higher pressure level. In this case, for instance helium acts as a working gas. A recovery system as illustrated in FIG. 10 has proven its value because of its particular efficiency.

The continuous material 1 is a stainless steel wire which is calcined, for example, to 1100 degrees Celsius. The discharge chambers 3a, 3b consist in each case of a stainless steel pipe with a length of 2 m and a diameter of 7 cm, which forms at the same time the vessel wall and the external electrode 5, as well as of a quartz glass tube 4 which is tightly attached to the external electrode 5 and ensures the electrical insulation of the external electrodes 5. The magnetic field is generated by two tubular permanent magnet assemblies 6 which are arranged concentrically outside of the discharge chambers 3a, 3b. A cooling liquid is located between the discharge chambers 3a, 3b and the permanent magnet assemblies 6. The two permanent magnet assemblies 6 are in each case magnetized in the longitudinal direction and are arranged such that the poles having equal names are oriented against each other. In this way it is achieved that no magnetic field prevails on the plane of symmetry between the two discharge chambers 3a, 3b. Hence, the continuous material 1 can there be "supported" mechanically (e.g. by a guide element 16, preferably a guide aperture, a lug, a coil or crossed plates) and thus can be prevented from vibrating without a discharge burning to said guide element 16.

A direct-current voltage, in particular a pulsed direct-current voltage, is applied as a voltage between the external electrodes 5 of the two discharge chambers 3a, 3b and the continuous material 1, which direct-current voltage is generated in separate energy supply devices (not illustrated). Thus, a further increase in the energy density can be achieved by pulse discharges, for instance, by means of a square wave signal with an amplitude of, e.g., approx. 300 V and a pulse repetition frequency of approx. 25 kHz. Other values of the amplitude and the pulse repetition frequency may also be chosen, wherein the pulses can partly also have reversed polarities. A pulsed direct-current voltage suppresses the undesired formation of arc discharges with a focal point.

The guide pulleys 14 are grounded and contact (ground) the continuous material 1. Ideally, they exhibit a radius ratio of 5:7. Both the discharge chambers 3a, 3b and the continuous-material gas cooling section 2 are liquid-cooled, for example, by means of oil. The oil is recirculated by a pump and cools down, via a heat exchanger, to the boiling temperature of the prepurification liquid (water or water with cleaning agents) in the fluid container of a continuous-material prepurification stage, in particular with coarse drying. In this manner, the prepurification liquid is heated and the temperatures of the discharge chambers 3a, 3b and those of the gas cooling section 2f are kept constant. A radiation detector which records the thermal radiation of the continuous material 1 and calculates therefrom the surface temperature of the continuous material 1 is located in the first postchamber 2a. Furthermore, a liquid cooling stage, in particular a water cooling stage, can be provided after the postchamber system. The entire process can be controlled via a regulating or control system 17, respectively, such as a process control SPS, or also via simple regulating or control systems, respectively, and via valves 18, which in particular are adjustable and controllable, respectively.

Various gases in combination with different pressures and magnetic field strengths are suitable for efficient plasma processing. Some of those combinations are exemplified.

|  | 100 mT | 500 mT | Comments on the Gas |
|---|---|---|---|
| He | ~5 mbar | ~25 mbar | good cooling properties and highest possible power densities |
| Ar | ~2.5 mbar | ~12.5 mbar | cost-efficient and fail-safe |
| $N_2$ | ~0.5 mbar | ~2.5 mbar | cost-efficient and fail-safe, suitable for nitration |
| $H_2$ |  |  | good cooling properties, explosible |

Gas mixtures may also be used for plasma processing. Thus, for instance, an addition of approx. one to three percent of hydrogen to a helium atmosphere is reasonable in order to make use of the advantages of the good ionizability of hydrogen whereas the predominant portion of helium guarantees operational safety.

Also noble gases in general, in particular helium, argon or krypton, with an addition of preferably one to ten, especially one to three, percent of a chemically active, in particular oxidizing or reducing, gas or vapour such as, for example, hydrogen, an alcohol or an alkane, can be used as working gases, for which in each case the corresponding pressures can be adjusted.

The corresponding optimum pressures are created via vacuum pumps 7a to 7d, preferably via cost-saving slide vane rotary pumps, and optionally via filters 8 and valves 18, whereby, at a given magnetic field, the required pressure for concentrating the plasma stream can be achieved in the area of the magnetic field.

FIGS. 8 and 9 show an installation for the plasma processing of workpieces 1' in a batch process, using a loading device which comprises in particular a charging opening 22. The charging opening 22 can be sealed in a vacuum-tight manner for example with a nonmagnetic lid 21. Instead of the lid 21, a plate 23 comprising at least one permanent magnet 61 may also be arranged, wherein said plate 23 may also comprise an iron yoke element. In order to be able to muster the sometimes substantial magnetic forces which must be overcome when operating said plate 23, an actuating device 24 can be provided which enables the movement of said plate 23 toward opening or closing, respectively, the charging opening 22 by means of suitable mechanical transmissions such as threaded rods or the like, or by means of hydraulic devices.

The invention claimed is:

1. An installation for the plasma processing of a continuous material, comprising at least one evacuatable discharge chamber, through which the continuous material is conveyed continuously, a device for setting a gas atmosphere in the at least one discharge chamber, wherein the device for setting a gas atmosphere comprises a prechamber system and a postchamber system, wherein the prechamber system comprises a prechamber divided into subchambers and/or the postchamber system comprises individual postchambers, wherein sluice openings are provided between the subchambers and the postchambers, respectively, wherein the continuous material is guided through the sluice openings and with low friction through the subchambers and postchambers, respectively, wherein the device for setting a gas atmosphere comprises a recovery system wherein gas is recirculated from a first one of the postchambers into a prechamber and/or a second one of the postchambers having a higher pressure level than the first one of the postchambers.

2. An installation according to claim 1, wherein at least one postchamber comprises a gas cooling chamber.

3. An installation according to claim 1, further comprising guide means for the continuous transport of the continuous material through at least one discharge chamber and the prechamber system and the postchamber system comprising a guide pulley each at the beginning and at the end, respectively, of the installation, the two guide pulleys having different diameters.

4. An installation according to claim 3, wherein the guide means comprises a guide aperture, a lug, a coil or crossed plates, in an area between two discharge chambers.

5. An installation according to claim 1, wherein the device for setting a gas atmosphere comprises a regulating or control system, respectively, comprising slide vane rotary pumps, and/or valves, by means of which the gas atmosphere is adjusted to a pressure adapted to a selected gas.

6. An installation according to claim 5, wherein the device for setting a gas atmosphere is adjusted to noble gases, especially to helium.

7. An installation according to claim 5, wherein the device for setting a gas atmosphere is adjusted to noble gases helium, argon or krypton, with an addition of one to ten percent of a chemically active oxidizing or reducing gas or vapour such as hydrogen, an alcohol or an alkane.

8. An installation according to claim 7, wherein the device for setting a gas atmosphere is adjusted to noble gases helium, argon or krypton, with an addition of one to three percent of a chemically active oxidizing or reducing gas or vapour such as, for example, hydrogen, an alcohol or an alkane.

9. An installation according to claim 5, wherein the vacuum pumps are aligned with the prechambers and the postchamber system such that a pressure gradation is adjusted, preventing ambient air from entering the discharge chambers.

10. An installation according to claim 1, wherein a prepurification stage comprising coarse drying is arranged in the working direction prior to the prechambers.

11. An installation according to claim 1, wherein a water cooling stage, is arranged in the working direction after the postchamber system.

12. An installation according to claim 1, wherein to significantly increase the obtainable energy density of the gas discharge, a high-performance magnet assembly for generating a magnetic field of at least 50 mT is arranged.

13. An installation according to claim 12, wherein the high-performance magnet assembly is designed as a superconducting electromagnet.

14. An installation according to claim 12, wherein the high-performance magnet assembly is designed as a permanent magnet assembly.

15. An installation according to claim 14, wherein the permanent magnet assembly comprises permanent anisotropic permanent magnets, which essentially foam the side walls of a prism having a polygonal cross-section.

16. An installation according to claim 15, wherein the cross-section of the prism is configured as a square or a hexagon.

17. An installation according to claim 14, wherein iron yoke elements are provided which concentrate the magnetic field of the permanent magnet assembly in the area of the gas discharge.

18. An installation according to claim 17, wherein the permanent magnets are each arranged essentially normal to iron yoke elements located adjacent to them so that exactly one pole of each permanent magnet abuts one of the iron yoke elements.

19. An installation according to claim 14, wherein a device for adjusting the magnetic fields of the permanent magnets to defined restricted current flows is provided.

20. An installation according to claim 14, wherein at least one permanent magnet and/or at least one yoke element is/are arranged in a removable, replaceable, displaceable or twistable fashion.

21. An installation according to claim 1, wherein, in the at least one evacuatable discharge chamber, an external anode that is electrically insulated and arranged around the continuous material, and an energy supply device for providing a voltage or a current, respectively, which is sufficient for a gas discharge between the continuous material acting as an internal cathode, and the external electrode, are provided, wherein the energy supply device is adjusted to a pulsed direct-current voltage, between the external electrode and the continuous material, wherein the pulses can partly also have reversed or varying polarities.

22. An installation according to claim 21, wherein the high-performance magnet assembly and/or the external electrodes are liquid-coolable.

* * * * *